United States Patent

Shepelev et al.

(10) Patent No.: US 9,652,072 B2
(45) Date of Patent: May 16, 2017

(54) FULL IN-CELL SENSOR

(71) Applicant: SYNAPTICS INCORPORATED, San Jose, CA (US)

(72) Inventors: Petr Shepelev, Campbell, CA (US); Thomas Mackin, Rochester, NY (US); David Hoch, Los Gatos, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 14/873,902

(22) Filed: Oct. 2, 2015

(65) Prior Publication Data

US 2016/0026330 A1 Jan. 28, 2016

Related U.S. Application Data

(63) Continuation of application No. 13/929,680, filed on Jun. 27, 2013, now Pat. No. 9,152,283.

(51) Int. Cl.
*G06F 3/041* (2006.01)
*G06F 3/044* (2006.01)
*G01R 27/26* (2006.01)

(52) U.S. Cl.
CPC ....... *G06F 3/0416* (2013.01); *G01R 27/2605* (2013.01); *G06F 3/044* (2013.01); *G06F 3/0412* (2013.01); *G06F 2203/04107* (2013.01)

(58) Field of Classification Search
CPC .............. G06F 3/0412; G06F 2203/04107
USPC ............ 178/18.01–19.07; 345/173–178
See application file for complete search history.

(56) References Cited

U.S. PATENT DOCUMENTS

| | | | |
|---|---|---|---|
| 5,847,690 A | 12/1998 | Boie et al. | |
| 2010/0001973 A1 | 1/2010 | Hotelling et al. | |
| 2010/0194695 A1 | 8/2010 | Hotelling et al. | |
| 2010/0194698 A1 | 8/2010 | Hotelling et al. | |
| 2010/0292945 A1* | 11/2010 | Reynolds | G06F 3/044 702/65 |
| 2011/0187677 A1 | 8/2011 | Hotelling et al. | |
| 2011/0248949 A1 | 10/2011 | Chang et al. | |
| 2011/0298746 A1 | 12/2011 | Hotelling | |
| 2012/0105337 A1 | 5/2012 | Jun et al. | |
| 2012/0162104 A1 | 6/2012 | Chang et al. | |
| 2012/0162584 A1 | 6/2012 | Chang et al. | |
| 2012/0206403 A1* | 8/2012 | Wang | G06F 3/044 345/174 |
| 2013/0016065 A1 | 1/2013 | Reynolds et al. | |

(Continued)

FOREIGN PATENT DOCUMENTS

| | | |
|---|---|---|
| KR | 20120005805 U | 8/2012 |
| WO | WO-2012177312 A1 | 12/2012 |

OTHER PUBLICATIONS

PCT/US2014/039895, Notification Concerning Transmittal of International Preliminary Report on Patentability, Dated Jan. 7, 2016, Consists of 7 pages.

*Primary Examiner* — Michael Pervan
(74) *Attorney, Agent, or Firm* — Patterson + Sheridan, LLP

(57) ABSTRACT

A display device having an integrated capacitive sensing device includes receiver electrodes disposed on a back side of a color filter glass. Transmitter electrodes of the capacitive sensing device are configured with a size and geometry that reduces the capacitive coupling between the transmitter and receiver electrodes. The transmitter electrodes may be made of one or more prongs or segments from a segmented common electrode.

16 Claims, 7 Drawing Sheets

(56) References Cited

U.S. PATENT DOCUMENTS

2013/0057512 A1     3/2013   Lillie et al.
2013/0127779 A1     5/2013   Lillie et al.
2013/0342770 A1*   12/2013   Kim ........................ G06F 3/044
                                                                                                                         349/12

\* cited by examiner

FULL IN-CELL SENSOR

CROSS-REFERENCE TO RELATED APPLICATIONS

This application is a continuation of U.S. patent application Ser. No. 13/929,680, filed Jun. 27, 2013, entitled "FULL IN-CELL SENSOR" which is herein incorporated by reference in its entirety.

FIELD

Embodiments of the present disclosure relate to an input device, processing system, and method for touch sensing.

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY OF THE DISCLOSURE

An input device, processing system for an input device, and method for operating capacitive touch sensors are disclosed herein. In one embodiment, a display device having an integrated capacitive sensing device. The display device includes a plurality of transmitter electrodes disposed on a first substrate and a second substrate. Each transmitter electrode includes a first plurality of common electrode segments interleaved with a second plurality of common electrode segments. The first plurality of common electrode segments is configured to be driven for display updating and capacitive sensing. The display device further includes a region defined between the first substrate and the second substrate. The region includes a plurality of color filters, a black mask, and a plurality of receiver electrodes. The plurality of receiver electrodes are aligned with regions defined between adjacent color filters. The display device includes a processing system coupled to the plurality of transmitter electrodes and the plurality of receiver electrodes. The processing system is configured to drive the first plurality of common electrode segments of a first transmitter electrode with a transmitter signal, and receive resulting signals with at least one receiver electrode. The resulting signals include effects corresponding to the transmitter signal. The first plurality of common electrode segments is capacitively coupled with the receiver electrode forming a transcapacitive coupling. The processing system is configured to, while driving the first plurality of common electrode segments, the second plurality of common electrode segments are configured to reduce the transcapacitive coupling between the first plurality of common electrode segments and the receiver electrode.

In another embodiment, a touch sensor for a display device having an integrated capacitive sensing device. The touch sensor includes a plurality of transmitter electrodes disposed on a first substrate, and a second substrate. Each transmitter electrode includes a first plurality of common electrode segments interleaved with a second plurality of common electrode segments. The first plurality of common electrode segments is configured to be driven for display updating and capacitive sensing and wherein the second plurality of common electrode segments is not driven for capacitive sensing. The touch sensor further includes a display material disposed between the first substrate and the second substrate. The plurality of transmitter electrodes is disposed between the first substrate and the display material. The touch sensor further includes a region defined between the second substrate and the display material. The region includes a plurality of color filters, a black mask, and a plurality of receiver electrodes. The plurality of receiver electrodes are disposed between the second substrate and the display material and are aligned with regions defined between adjacent color filters.

In another embodiment, a method for operating a display device having an integrated capacitive sensing device. The method includes driving a first plurality of common electrode segments of a first transmitter electrode with a transmitter signal. The first plurality of common electrode segments is configured to be driven for display updating and capacitive sensing. The method further includes receiving resulting signals with at least one receiver electrode. The resulting signals include effects corresponding to the transmitter signal. The first plurality of common electrode segments is capacitively coupled with the receiver electrode forming a transcapacitive coupling. The receiver electrode is disposed in a region defined between a first substrate and a second substrate. The region further includes a black mask, and a plurality of color filters, and the receiver electrode is aligned with a region defined between adjacent color filters. The method further includes, while driving the first plurality of common electrode segments, a second plurality of common electrode segments are configured to reduce the transcapacitive coupling between the first plurality of common electrode segments and the receiver electrode. The first plurality of common electrode segments is interleaved with the second plurality of common electrode segments.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
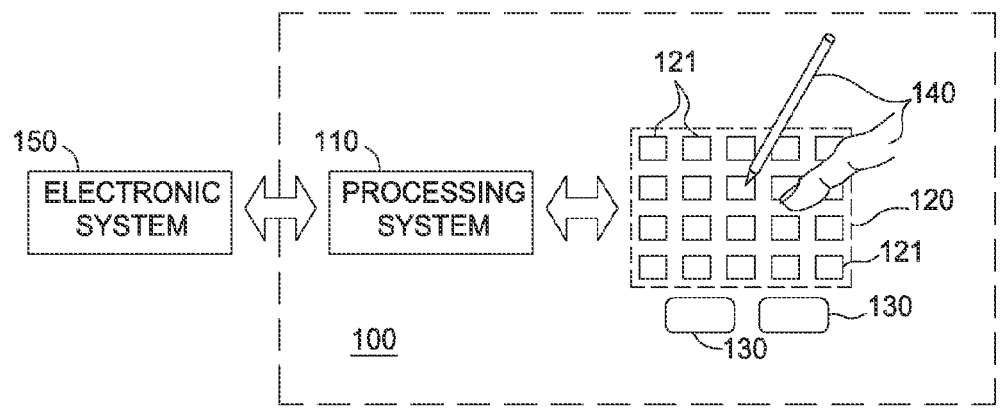
FIG. 1 is a schematic diagram of an input device, in accordance with embodiments of the disclosure.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIG. 1 is a block diagram of an input device 100, in accordance with embodiments of the present technology. Although embodiments of the present disclosure may be utilized in an input device 100 including a display device integrated with a sensing device, it is contemplated that the invention may be embodied in display devices without integrated sensing devices. The input device 100 may be configured to provide input to an electronic system 150. As used in this document, the term "electronic system" (or "electronic device") broadly refers to any system capable of electronically processing information. Some non-limiting examples of electronic systems 150 include personal computers of all sizes and shapes, such as desktop computers, laptop computers, netbook computers, tablets, web browsers, e-book readers, and personal digital assistants (PDAs). Additional example electronic systems 150 include composite input devices, such as physical keyboards that include input device 100 and separate joysticks or key switches. Further example electronic systems 150 include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system 150, or can be physically separate from the electronic system 150. As appropriate, the input device 100 may communicate with parts of the electronic system using any one or more of the following: buses, networks, and other wired or wireless interconnections. Examples include $I^2C$, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements 121 for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements 121 pick up loop currents induced by a resonating coil or pair of coils. Some combination of the magnitude, phase, and frequency of the currents may then be used to determine positional information.

In some capacitive implementations of the input device 100, voltage or current is applied to one or more capacitive sensing elements 121 to create an electric field between an electrode and ground. Nearby input objects 140 cause changes in the electric field, and produce detectable changes in capacitive coupling that may be detected as changes in voltage, current, or the like.

Some capacitive implementations utilize arrays or other regular or irregular patterns of capacitive sensing elements 121 to create electric fields. In some capacitive implementations, separate sensing elements 121 may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In FIG. 1, the processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as graphical user interface (GUI) actions such as cursor movement, selection, menu navigation, and other functions. In some embodiments, the processing system 110 provides information about the user input (or lack of user input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display device may share physical elements. For example, some embodiments may utilize some of the same electrical components for displaying and sensing. As another example, the display device may be operated in part or in total by the processing system 110.

It should be understood that while many embodiments of the present technology are described in the context of a fully functioning apparatus, the mechanisms of the present technology are capable of being distributed as a program product (e.g., software) in a variety of forms. For example, the mechanisms of the present technology may be implemented and distributed as a software program on information bearing media that are readable by electronic processors (e.g., non-transitory computer-readable and/or recordable/writable information bearing media readable by the processing system 110). Additionally, the embodiments of the present technology apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
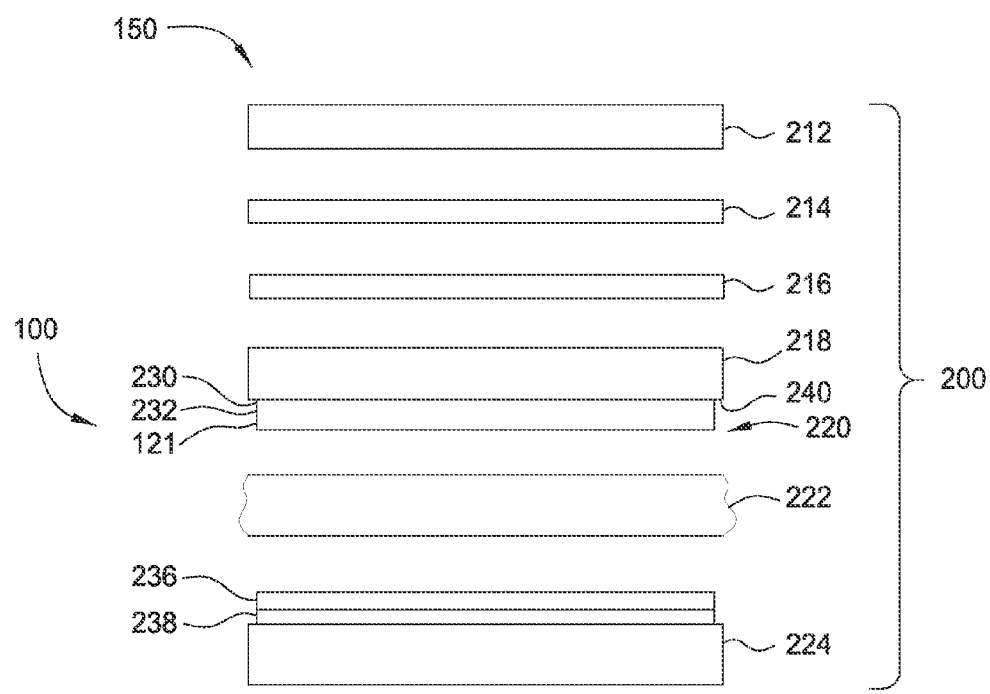
FIG. 2 is an exploded view of an electronic system having an input device disposed within the electronic system, according to one embodiment.

FIG. 2 is an exploded view of an electronic system 150 having an input device 100 disposed within the electronic system 150. The input device 100 generally includes a display device 200 interfaced with a sensor device that is configured to sense input provided by one or more input objects 140 in a sensing region 120, as illustrated in FIG. 1. In the embodiment shown in FIG. 2, the input device 100 includes a plurality of sensing elements 121 as described herein that may be disposed within the display device 200.

The display device 200 generally includes a plurality of transparent substrates positioned over a first substrate 224 (sometimes referred to as TFT glass) of an active element 238 of the display device. The active element 238 may include one or more thin-film-transistor (TFT) layers comprising display update circuitry configured to update a plurality of pixels. The TFT layers of the active element 238 may be electrically coupled to a reference voltage (referred to as V-com) by one or more conductive electrodes, referred to herein as V-com electrodes 236. In one embodiment, the V-com electrode 236 may be disposed on a TFT substrate (i.e., first substrate 224) of the display device 200. In the embodiment shown in FIG. 2, the V-com electrodes 236 are disposed on top of TFT layers of the active element 238 on the first substrate 224. As described further below, in some embodiments, the V-com electrodes 236 may be segmented into a plurality of common electrode segments and used for both display updating and capacitive sensing.

In one embodiment, the plurality of transparent substrates positioned over the substrate 224 of the display device 200 includes a second substrate (referred to herein as a color filter glass 218, or CFG), lens 212, an optional polarizer 214, and an optional anti-shatter film 216. A layer of display material 222 (e.g., liquid crystal) may be disposed between the color filter glass 218 and the substrate 224.

In one embodiment, a region 220 defined between the color filter glass 218 and the substrate 224 includes a plurality of color filters 230 and a black mask 232 (sometimes referred to as black matrix).

In one embodiment, the sensing elements 121 of the input device 100 are disposed at least partially within the region 220. The sensing elements 121 may be disposed between the color filter glass 218 and the display material 222, as shown in FIG. 2. In embodiments sometimes referred to as "in-cell" configurations, the sensing elements 121 may alternatively be positioned on, at least partially formed directly on, or fully formed directly on a lower side 240 of the color filter glass 218. In one embodiment, some components (e.g., receiver electrodes) of the sensing elements 121 are arranged such that the components of the sensing elements 121 are aligned with regions defined between adjacent color filters 230, as described below in conjunction with FIGS. 5A-5B. Where the sensing elements 121 are formed at least partially directly on, formed fully on, or within the substrate 224 of the active element 238 of the display device 200, transmitter electrodes of the sensing elements 121 may be comprised of common electrodes (segments of segmented V-com electrode 236) disposed between the substrate 224 and the display material 222

Figure 3:
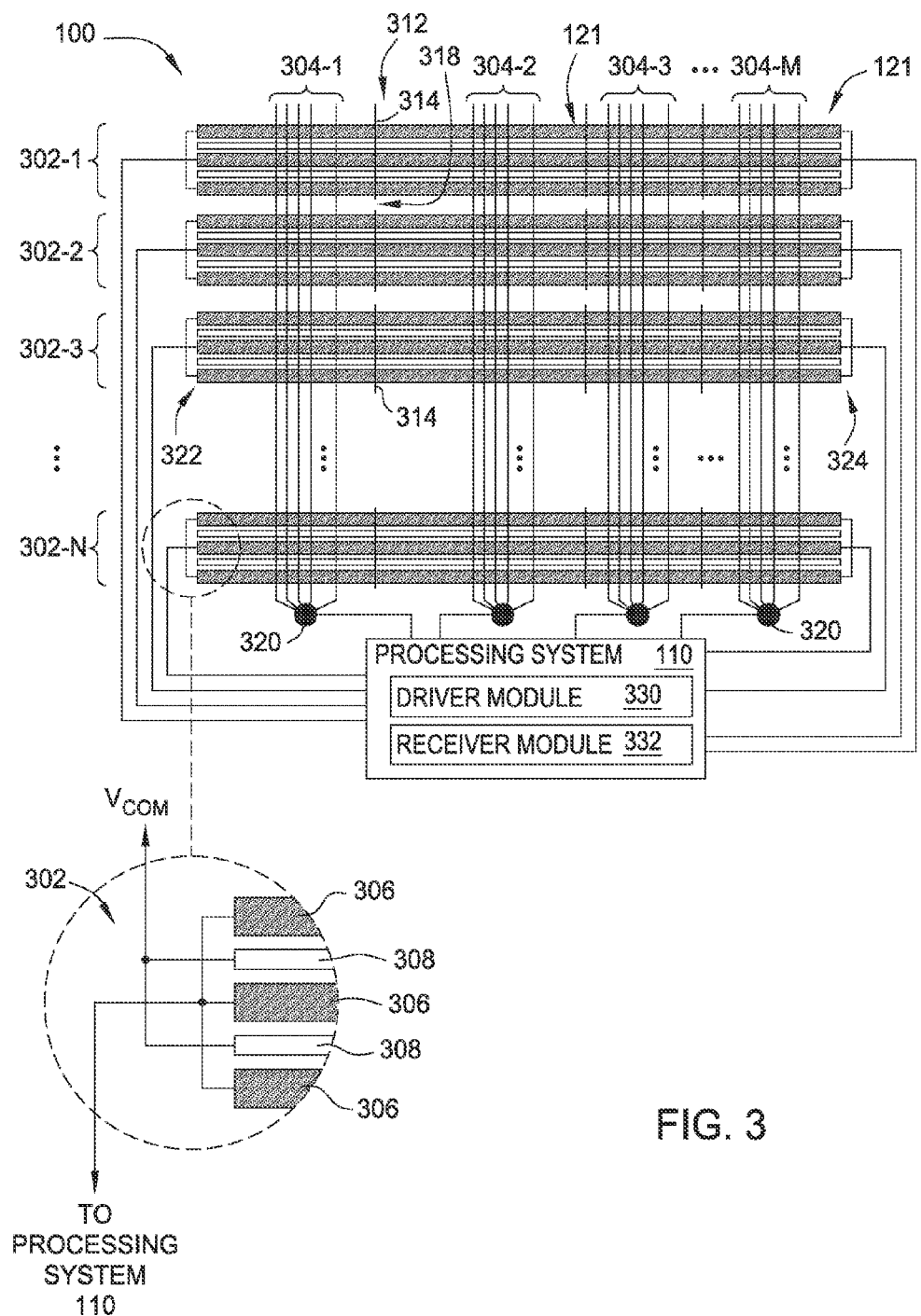
FIG. 3 illustrates an exemplary sensor pattern of the input device, according to one embodiment of the disclosure.

FIG. 3 illustrates an example sensor pattern of the input device, according to one embodiment of the disclosure. For clarity of illustration and description, FIG. 3 shows the sensing elements 121 in a pattern of simple rectangles and shapes, and does not show various components. The sensing elements 121 may have other suitable geometry or form. The illustrated pattern of sensing elements 121 comprises a first plurality of sensor electrodes 302 (302-1, 302-2, 302-3, . . . 302-n), and a second plurality of sensor electrodes 304 (304-1, 304-2, 304-3, . . . 304-m) disposed over the first plurality of sensor electrodes 302. In one embodiment, processing system 110 is coupled to sensor electrodes 302 and 304 and is configured to transmit transmitter signals with the first plurality of sensor electrodes 302 and receive resulting signals with the second plurality of sensor electrodes 304. In such an embodiment, the first plurality of sensor electrodes may be referred to as a plurality of transmitter electrodes 302 (302-1, 302-2, 302-3, . . . 302-n), and the second plurality of sensor electrodes may be referred to as a plurality of receiver electrodes 304 (304-1, 304-2, 304-3, . . . 304-m). In one embodiment, the plurality of receiver electrodes 304 may be disposed over the plurality of transmitter electrodes 302. In another embodiment, processing system 110 may be configured to transmit and receive with both the first plurality of sensor electrodes and the second plurality of sensor electrodes.

The areas of localized capacitive coupling between transmitter electrodes 302 and receiver electrodes 304 may be termed "capacitive pixels." The capacitive coupling between the transmitter electrodes 302 and receiver electrodes 304 change with the proximity and motion of input objects in the sensing region associated with the transmitter electrodes 302 and receiver electrodes 304.

In some embodiments, the sensor pattern is "scanned" to determine these capacitive couplings. That is, the transmitter electrodes 302 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and effectively produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 304 to be independently determined.

The receiver electrodes 304 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

The background capacitance of a sensor device is the capacitive image associated with no input object in the sensing region. The background capacitance changes with the environment and operating conditions, and may be estimated in various ways. For example, some embodiments take "baseline images" when no input object is determined to be in the sensing region, and use those baseline images as estimates of their background capacitances.

Capacitive images can be adjusted for the background capacitance of the sensor device for more efficient processing. Some embodiments accomplish this by "baselining" measurements of the capacitive couplings at the capacitive pixels to produce a "baselined capacitive image." That is, some embodiments compare the measurements forming a capacitance image with appropriate "baseline values" of a "baseline image" associated with those pixels, and determine changes from that baseline image.

In some touch screen embodiments, transmitter electrodes 302 comprise one or more common electrodes (e.g., V-com electrode 236, or source drive electrode) used in updating the display of the display screen. These common electrodes may be disposed on an appropriate display screen substrate. For example, the common electrodes may be disposed on the TFT glass 224 in some display screens (e.g., In Plane Switching (IPS) or Plan to Line Switching (PLS)), as shown in FIG. 2. In such embodiments, the common electrode can also be referred to as a "combination electrode", since it performs multiple functions. In some embodiments, at least two transmitter electrodes 302 may share at least one common electrode.

According to embodiments of the present disclosure, it has been determined that the dielectric property of some display materials 222 (e.g., liquid crystal material) may be anisotropic. That is, the dielectric constant may be different in different directions, e.g., horizontal and vertical. In certain display devices, such as in-plane switching (IPS) display devices, the liquid crystal molecules of the display material are aligned in-plane and rotate only in horizontal directions. This may result in a constant perpendicular component of the liquid crystal material's dielectric constant, which facilitates touch sensing independent from a LCD display image. As a consequence, "fringing-field" capacitance may dominate over a "parallel-plate" component of capacitance in a sensing element arranged according to embodiments of the present disclosure. While conventional techniques for patterning transmitter electrodes in a sensor device may use rectangular bars separated by a sub-pixel gap, it has been determined that the capacitance between a transmitter electrode and receiver electrode (e.g., $C_t$) in such an embodiment may reach the range of 100 pF for receiver electrodes. Such values for capacitive coupling may be outside the range of known processing systems, and in generally, may be impractical for processing.

Accordingly, embodiments of the present disclosure propose a reduction in area of a transmitter electrode by changing a geometry and size of the transmitter electrodes. In one embodiment, a transmitter electrode 302 includes one or more prongs per transmitter pitch. It has been determined that a multi-prong transmitter electrode provides improved uniformity of a spatial response to a touch over other geometries. Accordingly, in one embodiment, each prong of a transmitter electrode may be a common electrode segment.

According to one embodiment, the V-com electrode 236 may be segmented and patterned into a plurality of common electrode segments 306, 308. Some of the common electrode segments may be used for display updating, capacitive sensing, or both. In the embodiment shown in FIG. 3, transmitter electrodes 302 may include a plurality of common electrode segments 306 configured to be driven for both display updating and capacitive sensing. In one embodiment, the common electrode segments 306 may be interleaved with a second plurality of electrode segments 308. The second plurality of common electrode segments 308 may be connected to a reference voltage (e.g., V-com) during display update periods and maintained at a substantially constant voltage level (or electrically floated) while touch sensing is perform. As such, the second plurality of electrode segments 308 may be used for updating the display and not for capacitive sensing.

Various configurations of the transmitter electrodes 302 having one or more common electrode segments 306 interleaved with one or more common electrode segments 308 may be selected to obtain a desired transcapacitance coupling (e.g., $C_t$) between a transmitter electrode 302 and receiver electrode 304. In some embodiments, the number of common electrode segments 306 that comprise a transmitter electrode 302 is selected to reduce the transcapacitive coupling that would otherwise occur if both sets of common electrode segments 306 and 308 would driven for capacitive sensing. Further, while the embodiment of FIG. 3 illustrates a transmitter electrode 302 comprising three segments 306, each transmitter electrode 302 may have more than three segments 306, and between each segment 306, a common electrode segment 308 not used for capacitive sensing may be present.

Further, while the common electrode segments 306, 308 are illustrated as a solid block, in various embodiments, each common electrode segment 306 of the transmitter electrodes 302 and/or the common electrode segments 308 may comprise multiple segments of the segmented V-com electrode 236.

While the embodiment of FIG. 3 depicts the common electrode segments spanning the length of the sensing region, it should be recognized that alternative geometries and configurations for transmitter electrodes and common electrode segments are well within the scope of the present disclosure. An exemplary alternative embodiment is shown in FIG. 4.

Figure 4:
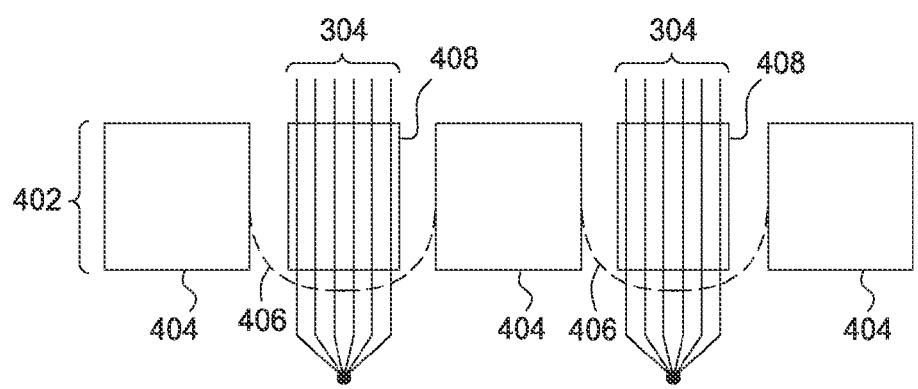
FIG. 4 depicts an alternative embodiment of a transmitter electrode having interleaved common electrode segments that may overlap with receiver electrodes.

FIG. 4 depicts an alternative embodiment of a transmitter electrode 402 having a first plurality of common electrode segments 404 interleaved with a second plurality of common electrode segments 408 that overlaps with at least one of the receiver electrodes 304. In the embodiment shown in FIG. 4, the transmitter electrode 402 is oriented perpendicular to the receiver electrodes 304 and is segmented along the length of the transmitter electrode 402 into common electrode segments 406 and 408. In some embodiments, the transmitter electrode 402 may be segmented into common electrode segments such that the common electrode segments (e.g., segments 408) that overlap with receiver electrodes 304 are not used for touch sensing and are connected to a reference voltage (e.g., V-com) used for display updating. The other common electrode segments 404 are configured for both display updating and capacitive sensing and may be electrically coupled together using a plurality of jumpers 406. In one embodiment, the jumpers 406 may be insulated from the common electrode segments 408 and the receiver electrodes 304.

In operation, during touch sensing, the common electrode segments 408 may be driven in a similar manner as common electrode segments 306 to reduce the capacitive coupling between the transmitter and receiver electrodes. It has been determined that the change in transcapacitance (i.e., $\Delta C_t$) between transmitter electrode 402 and receiver electrode 304 (e.g., caused by object presence within the corresponding sensing region) remains similar to that of a sensor electrode array having solid, un-segmented transmitter electrodes. However, it has been further determined that the capacitive coupling (i.e., $C_t$) between the transmitter electrode 402 and receiver electrode 304 is decreased, and that the capacitive load (i.e., $C_{load}$) per receiver electrode increases in the same time. Accordingly, embodiments of the present disclosure advantageously provide a tradeoff between capacitive coupling ($C_t$) and the receiver's capacitive load, while keeping the change in transcapacitance ($\Delta C_t$) nearly or fully constant. It should be further appreciated that by not using common electrode segments 408 that overlap with receiver electrodes for touch sensing, embodiments of the present disclosure reduce the "parallel-plate" component of capacitive coupling between transmitter electrode 402 and receiver electrodes 304, which may be less useful for more changes in transcapacitance caused by object presence than the "fringing field" component of the capacitive coupling.

Referring back to FIG. 3, in one embodiment, the receiver electrodes 304 are disposed on the color filter glass 218 under and aligned with the black mask 232, such that the receiver electrodes 304 are disposed between the display material 222 (e.g., liquid crystal material) and the color filter glass 218. In another embodiment, the receiver electrodes 304 are disposed on the TFT substrate 224. In such an embodiment, the receiver electrodes 304, transmitter electrodes 302, and ground electrodes (e.g., segments 308) are electrically isolated from each other. For example, one or more jumpers may be used to insulate a transmitter electrode 302 from a receiver electrode 304 and or a ground electrode. Further, the one more jumpers may be used to insulate a ground electrode (e.g., segments 308) from a receiver electrode 304. Receiver electrodes 304 are shown in greater detail in FIGS. 5A and 5B.

Figure 5A:
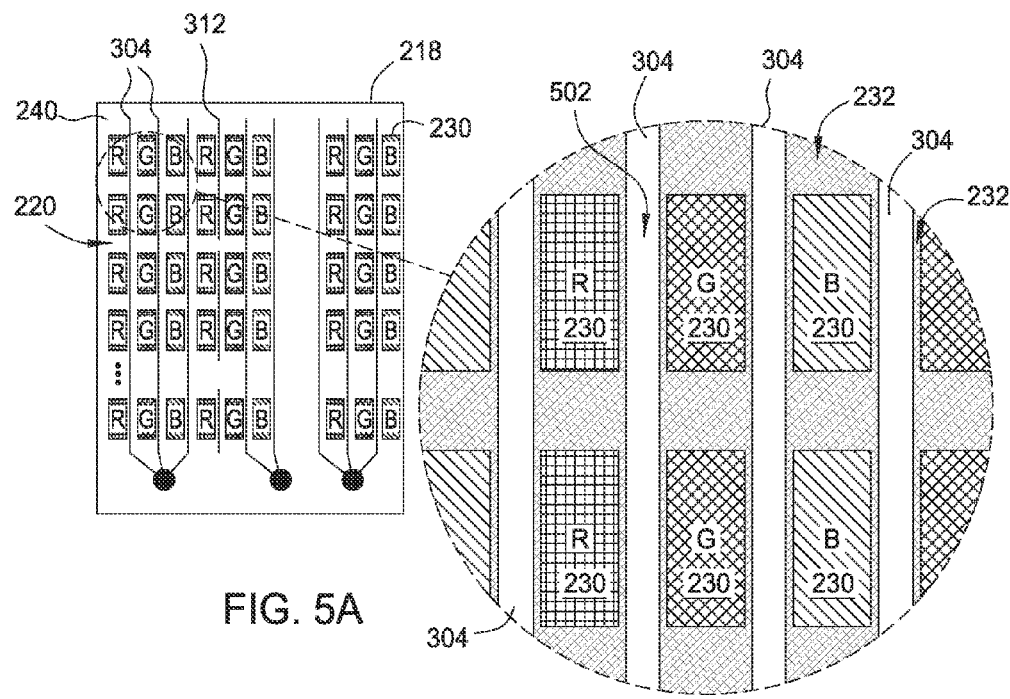
FIG. 5A illustrates a region defined between a color filter glass and a substrate having a plurality of receiver electrodes, according to one embodiment of the disclosure.

FIG. 5A illustrates in greater detail the region 220 defined between a color filter glass 218 and a substrate 224 having a plurality of receiver electrodes 304, according to one embodiment of the disclosure. The region 220 defined between the color filter glass 218 and a substrate (e.g., substrate 224) includes a plurality of color filters 230 and a black mask 232 used to hide underlying elements, such as certain parts of the TFTs in the TFT substrate 224. The substrate 224 is not shown for clarity of illustration. The color filters 230 may correspond to sub-pixels (e.g., red, green, blue) of the display device, and may be arranged in a pattern of rows and columns.

According to one embodiment, the plurality of receiver electrodes 304 may be aligned with regions 502 between the color filters 230. In some embodiments, the regions 502 may be defined by borders of adjacent color filters 230, for example a right edge of red color filter and a left edge of a green color filter. In other embodiments, the region 502 between the color filters 230 may be defined by an interstitial space between color filters disposed on the color filter glass 218 formed, for example, for deposit of black mask material. In the embodiment shown in FIG. 5A, the plurality of receiver electrodes 304 are disposed within the region 220 in a vertical orientation relative to the color filters 230. That is, the receiver electrodes 304 may be arranged between columns of sub-pixels, e.g., columns of red color filters, green color filters, and blue color filters. While FIG. 5A illustrates the plurality of receiver electrodes 304 disposed within region 220 in a vertical orientation relative to the color filters 230, in other embodiments, the receiver electrodes 304 may be oriented in a horizontal direction relative to the color filters 230, i.e., between rows of sub-pixels.

In the embodiment shown in FIG. 5A, the receiver electrodes 304 may be non-transparent, conductive electrodes aligned with a portion of the black mask 232 disposed between adjacent color filters 230. In some embodiments, the receiver electrodes 304 may be non-transparent, metal traces. In one particular embodiment, a receiver electrode 304 may have a width of approximately 2-3 µm. A number of conductive electrodes may be used together to achieve a desired receiver electrode pitch. For example, to achieve a receiver electrode pitch of 4.5 mm, and assuming an embodiment having color filters with a width of approximately 20-30 µm, 100 or more conductive electrodes may be used to achieve the desired pitch, depending on the display device diagonal size and display resolution.

In some embodiments, the receiver electrodes 304 are disposed on the lower side 240 of the color filter glass 218 under and aligned with the black mask 232, such that the receiver electrodes 304 are disposed between the liquid crystal material 222 and the color filter glass 218. In some embodiments, the receiver electrodes 304 may be fully or at least partially disposed within the black mask 232 between color filters 230. In other embodiments, the receiver electrodes 304 may be fully or at least partially disposed underneath black mask 232 between color filters 230 such that the black mask 232 obscures the appearance of the receiver electrodes 304. While embodiments of the present disclosure describe one configuration having black mask 232 "between" color filters 230, alternative embodiments may be used, for example, having a matrix of black mask 232 disposed fully or at least partially on a contiguous array of color filters 230.

Figure 5B:
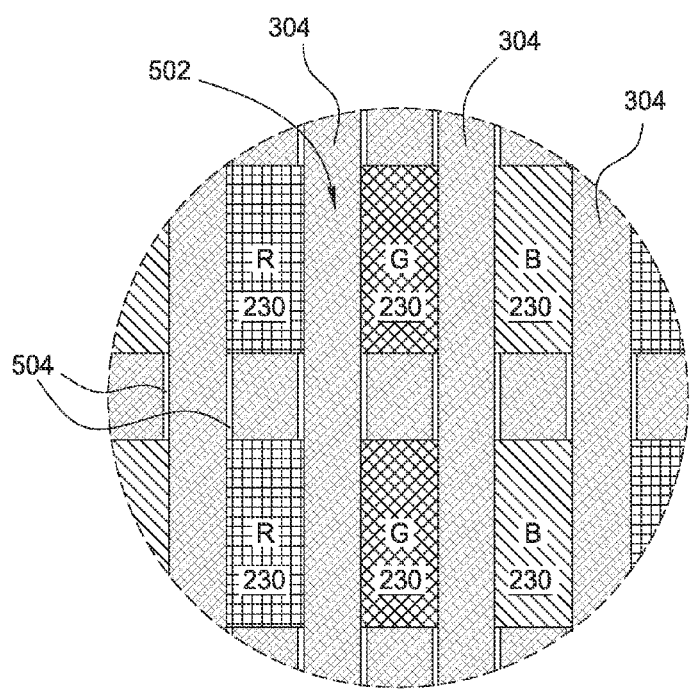
FIG. 5B illustrates an alternative embodiment of the receiver electrodes disposed within the region defined between the color filter glass and the substrate.

FIG. 5B illustrates an alternative embodiment of the receiver electrodes 304 disposed within the region 220 defined between the color filter glass 218 and the substrate 224. In the embodiment shown, the plurality of receiver electrodes 304 may be made of a black mask material itself which is conductive. In some embodiments, the receiver electrodes 304 may be made of a non-transparent, non-reflective, conductive black mask material. In one embodiment, each receiver electrode 304 may be electrically isolated from other receiver electrodes as depicted by regions 504, which may comprise, for example, non-conductive black mask material, other non-conductive material, an air gap or any other insulative material.

According to embodiments of the present disclosure, it has been determined that conductive electrodes (e.g., metal material) disposed on back side 240 of the color filter glass 218 may cause distortions to orientation of liquid crystal molecules near locations of these conductive electrodes. Such distortions may result in undesirable display artifacts in the display device that are perceptible by a user. It has been further determined that such distortions are caused by a charge build-up if these receiver electrodes are kept floated. Accordingly, in one embodiment, the black mask 232 may be extended from the receiver electrode 304 to hide such display artifacts from a user. Black mask material may extend from the receiver electrode such that black mask material is disposed between the receiver electrode and adjacent color filters 230. In another embodiment, the receiver electrodes 304 may be operated to decrease charge build-up, as described in greater detail below.

Referring back to FIG. 3, it should be appreciated that, in some embodiments, while receiver electrodes 304 may be formed aligned with every regions between color filters, i.e., between sub-pixels of a display device, a certain subset of the receiver electrodes 304 may be selected and configured to capacitive sensing to achieve a desired receiver pitch and sensor pattern geometry, and the remaining receiver electrodes may not be used. As such, according to one embodiment, the input device 100 may include one or more "disused" receiver electrodes 312 disposed between groups of receiver electrodes 304. A disused receiver electrode 312 is configured similar to a receiver electrode 304, but is not used for capacitive sensing or not connected to the processing system 110. It should be appreciated that the disused receiver electrodes 312 may be formed similarly as the receiver electrodes 304, for example, from non-transparent conductive traces or conductive black mask material disposed within a region 220. In one embodiment, a disused receiver electrode 312 may be formed by cutting a receiver electrode 304 into a plurality of segments 314 electrically insulated by gaps 318 at least at each transmitter pitch. In the embodiment shown, the disused receiver electrode is cut into segments 314 such that each segment 314 overlaps only a single transmitter electrode 302, although in other embodiment segments 314 may overlap more than one transmitter electrode 304. The segmented configuration of the disused receiver electrode 312 reduces capacitive coupling that might otherwise occur between different transmitter electrodes 302, e.g., via an un-cut receiver electrode 304 that overlaps all the transmitter electrodes 302.

In one embodiment, the processing system 110 is configured to operate the hardware of the input device 100 to detect input in the sensing region—e.g., some portion of the display screen. In the embodiment shown, the processing system 110 includes at least a driver module 330 and a receiver module 332 coupled to the plurality of transmitter electrodes 302 and the plurality of receiver electrodes 304. In some embodiments, the driver module 330 may be implemented as a touch sensing controller module communicatively coupled to a separate display driver controller, or as a single controller configured to provide both touch sensing and display updating.

In one embodiment, the driver module 330 is configured to drive one or more transmitter electrodes with a transmitter signal for capacitive sensing. The driver module 330 may include driver circuitry coupled to the transmitter electrodes 302 and configured to drive the hardware components for capacitive sensing and for display updating. In the embodiment shown, the transmitter electrodes 302 may be "double-routed" to the processing system 110, i.e., connected by both ends 322 and 324 of a transmitter electrode 302 (or ends of common electrode segments 306) to driver module 330.

In one embodiment, the receiver module 332 having receiver circuitry is coupled to the plurality of receiver electrodes 304. In some embodiments, the plurality of receiver electrodes 304 may be coupled to the processing system 110 through a plurality of "silver ball" connectors 320 that provide an electrical connection from one substrate (e.g., CFG 218) to another substrate (e.g., TFT glass 224). Connecting the receiver electrodes 304 to routing on the TFT glass 224 via silver ball connectors 320 allows removal of a separate flexible printed circuit (FPC), thereby decreasing cost of the processing system 110. In some embodiments, the receiver electrodes 304 may be double-routed to the processing system 110, similar to the transmitter electrodes 302 described earlier. The receiver module 332 is configured to receive resulting signals from the plurality of receiver electrodes 304 when performing capacitive sensing within the sensing region 120. In one embodiment, the processing system 110 is further configured to determine positional information based on resulting signals. In some embodiments, the processing system 110 may be configured to generate an indication of object presence in the sensing region 120 based on resulting signals received by the receiver electrodes 304.

Figure 6:
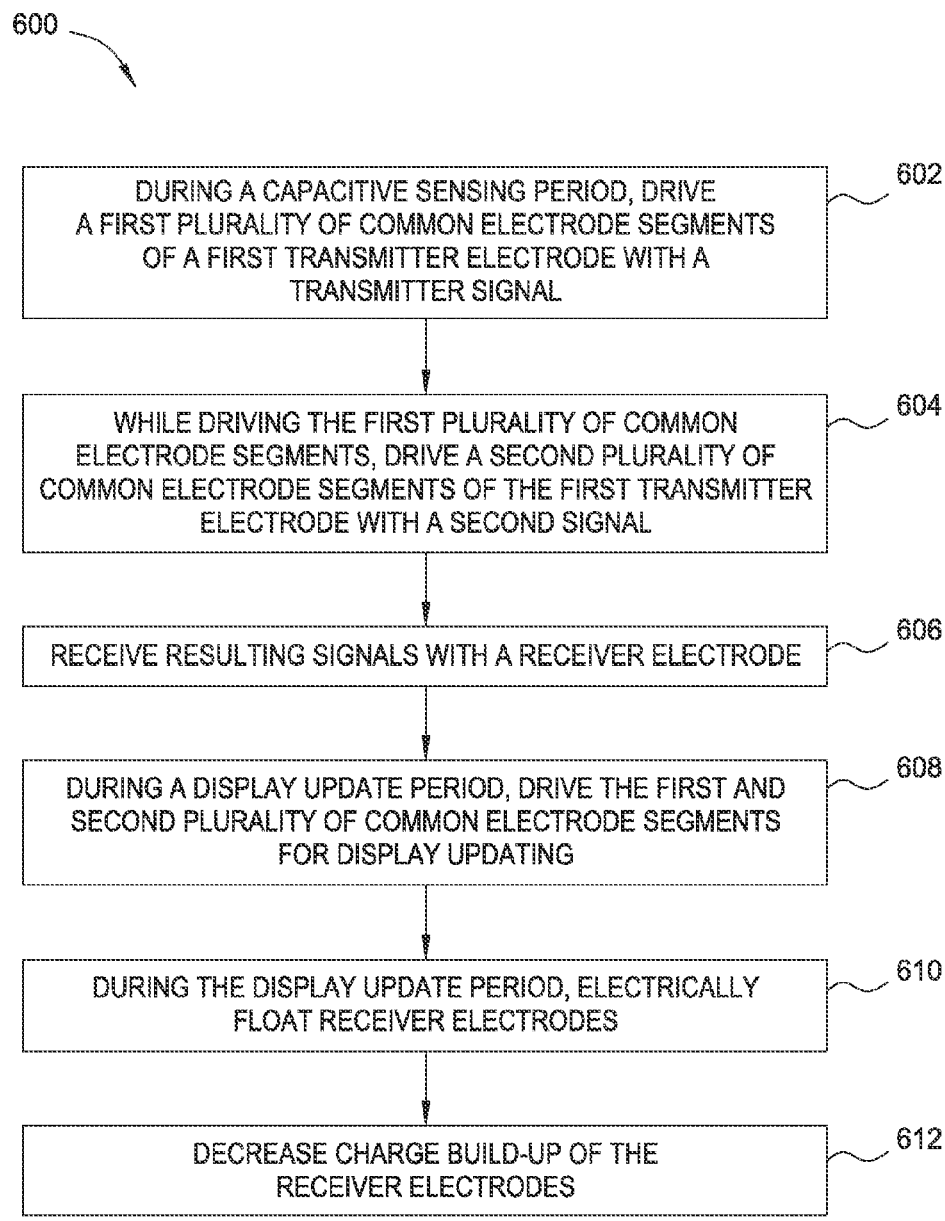
FIG. 6 is a flow diagram illustrating a method for operating an input device, according to one embodiment of the disclosure.

FIG. 6 is a flow diagram illustrating a method 600 for operating an input device, according to one embodiment of the disclosure. In the embodiment shown, at step 602, the processing system 110 of the input device 100 drives a first plurality of common electrode segments 306 of a first transmitter electrode 302 with a transmitter signal.

While driving the first plurality of common electrode segments 306, at step 604, the processing system 110 operates the second plurality of common electrode segments 308 to reduce the transcapacitive coupling between the first plurality of common electrode segments 306 and a receiver electrode 304 compared to if the second plurality of common electrode segments 308 were also driven with the transmitter signal. In some embodiments, the processing system 110 drives the second plurality of common electrode segments 308 with a substantially constant voltage, which may include a ground voltage or system reference voltage (i.e., V-com); however, other substantially constant voltage may be used as well. In other embodiments, the processing system 110 electrically floats the second plurality of common electrode segments 308. In other embodiments, the processing system 110 drives the second plurality of common electrode segments 308 with a varying voltage.

At step 606, the receiver module of the processing system 110 receives resulting signals with at least one receive electrode 304. As described earlier, the resulting signals comprise effects corresponding to the transmitter signal, and the first plurality of common electrode segments 306 are capacitively coupled with the at least one receiver electrode 304, thereby forming a transcapacitive coupling. The processing system 110 may generate an indication of an object presence or lack thereof in the sensing region 120 based on the resulting signal.

At step 608, during a display update period of a display frame, the processing system 110 drives the first and second plurality of common electrode segments 306 and 308 for display updating. In some embodiments, the first and second plurality of common electrode segments 306 and 308 are driven to a ground reference voltage, e.g., V-com, used by the TFT layers for display updating.

At step 610, in one embodiment, while performing display updating, the processing system 110 may electrically float the plurality of receiver electrodes 304. In another embodiment, during display updating, the processing system 110 may drive the receiver electrodes 304 with a substantially constant voltage, which may include a ground voltage, common voltage (e.g., V-com) or other system reference voltage.

At step 612, the processing system 110 decreases charge build-up of one or more receiver electrodes to reduce effects on the display material 222. As described earlier, the proximity of the receiver electrodes to the liquid crystal material in the stack-up shown in FIG. 2 may impact orientation of liquid crystal molecules and cause display artifacts.

In one embodiment, to reduce impact on orientation of liquid crystal material, the processing system 110 may connect the receiver electrodes 304 to a DC offset periodically, for example, when performing capacitive sensing with the receiver electrodes (e.g., at step 606), to drain charge build-up. The DC offset may be substantially equal to a reference voltage (e.g., V-com level) used for the common electrode segments 308. In some embodiments, the receiver electrodes 304 may be driven with a DC offset all the time while the display device is operating, or at least for time periods of a display update. In some embodiments, the processing system 110 may drive the receiver electrodes 304 with an offset voltage that drains charge buildup during a capacitive sensing period, which may be non-display update periods within the display frame. In embodiments that float the receiver electrodes for display update periods, as in step 606, the receiver electrodes 304 may be reset to an initial level for touch sensing at a beginning of each capacitive sensing period. Accordingly, the receiver electrodes 304 may be left floated for short predetermined and controlled periods of times, thereby decreasing possibility for a charge buildup on the receiver electrodes. Further, any charge which has built up may be drained during touch sensing periods as a reset to a DC offset happens.

Figure 7:
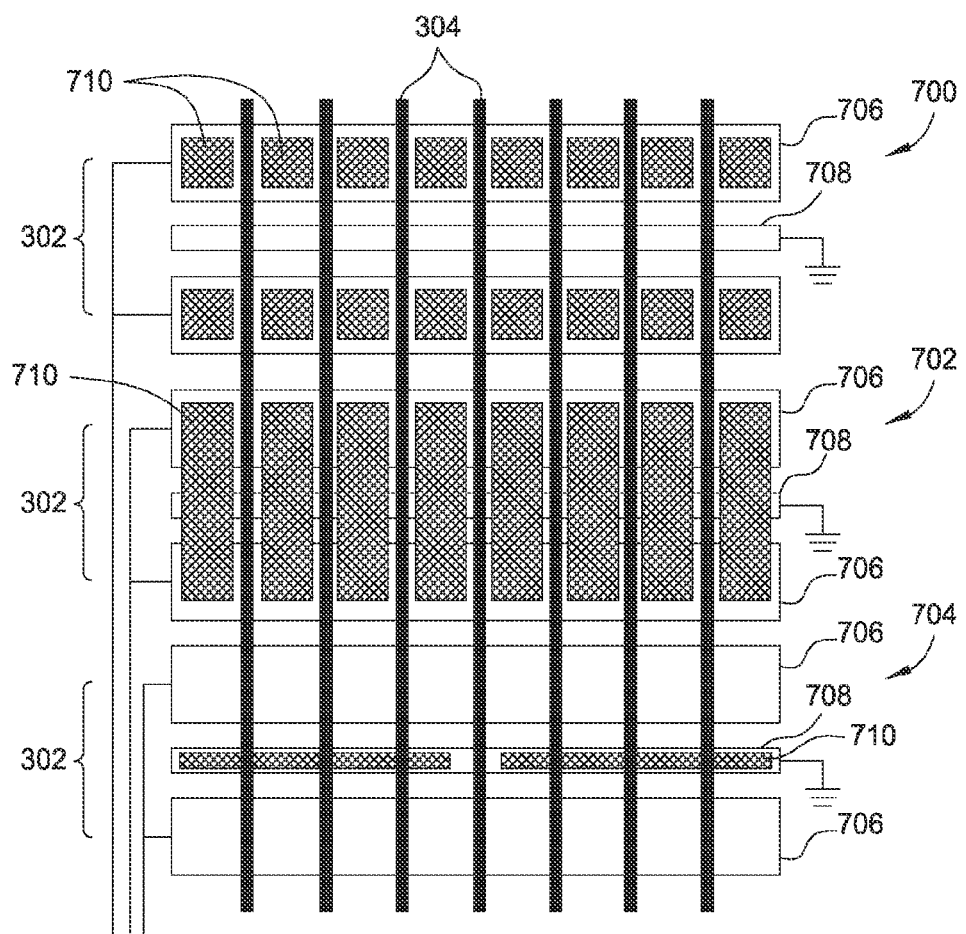
FIG. 7 illustrates exemplary sensor electrode patterns for an integrated display device and capacitive sensing device, according to one embodiment of the disclosure.

FIG. 7 illustrates exemplary sensor electrode patterns 700, 702, 704 for an integrated display device and capacitive sensing device, such as input device 100, according to one embodiment of the disclosure. The sensor electrode patterns 700, 702, 704 include various embodiments for optimizing receiver signal-to-noise ratio (SNR) and dynamic range. In each embodiment, the sensor electrode pattern includes a combination of floating electrodes 710 and ground electrodes 708.

For many integrated display and capacitive sensing devices, the capacitive coupling between transmitter and receiver electrodes (i.e., $C_t$) and the background capacitance ($C_b$) may be too high compared to the change in capacitive coupling ($\Delta C_t$) that can expected due to an input object. It has been determined that, by varying the inclusion of floating electrodes and ground electrodes as well as the size and shape of the transmitter electrodes, embodiments of the present disclosure can alter the ratio of $C_t+C_b$ to $\Delta C_t$ to improve the performance of the touch sensing device.

In various embodiments, the V-com electrode 236 can be segmented and patterned into transmitter electrodes 302 and grounded electrodes 708. In various embodiments, the ground electrodes 708 may be driven with any substantially constant voltage, which may include a ground voltage or system reference voltage; however, other substantially constant voltage may be used as well. In one embodiment, the V-com electrode 236 may be segmented and patterned into ground electrodes 708 and transmitter electrodes 706 to minimize non-user-input responsive capacitance relative to user-input-responsive capacitance. For example, the ratio of capacitive coupling between transmitter and receiver electrodes ($C_t$) and the background capacitance ($C_b$) to the change in capacitive coupling ($\Delta C_t$) that can expected due to an input object can be altered to improve the performance of the touch sensing device. Further, one or more floating electrodes 710 may be included within the sensor pattern.

In one embodiment, lowering $C_t$ makes the user input device position determining measurement (i.e., $\Delta C_t$) less sensitive to variations in $C_t$ that are not caused by a user input device.

The sensor electrode pattern 700, as shown in FIG. 7, can comprise one or more ground electrodes 708. In one embodiment, a ground electrode is interleaved between segments 706 of a transmitter electrode. In other embodiments, the transmitter electrodes 302 may be one contiguous segment, surrounded on either side by ground electrode 708. Further, while the embodiment of FIG. 7 illustrates a transmitter electrode 302 comprising two segments 706, each transmitter electrode 302 may have more than two segments 706 and between each segment 706 a ground electrode 708 may be present. In other embodiments, both ground electrodes 708 and floated electrodes 710 may be interleaved between segments 706 of the transmitter electrode 302.

In one embodiment, one or more electrically floating electrodes 710 may be disposed within the sensor electrode patterns 700, 702, 704. As shown in FIG. 7, the floating electrodes 710 may be sized such that they cover a portion of or substantially the entire width of a transmitter electrode segment 706. Further, a floating electrode 710 may cover more than one segment of the transmitter electrode 706, as shown in sensor electrode pattern 702. In various embodiments, a floating electrode 710 may be disposed between each receiver electrode 304. However, in other embodiments, a floating electrode 710 may be disposed in some other pattern. Further, while not shown in FIG. 7, a floating electrode 710 may be disposed over multiple transmitter electrodes 302. Additionally or alternatively to the earlier-discussed embodiments, a floating electrode 710 may be disposed parallel to a ground electrode 708, as shown in sensor electrode pattern 704, such that the floating electrode 710 is interdigitated between segments 706 of the transmitter electrodes 302. In various embodiments, a floating electrode 710 may be disposed between segments 706 of a transmitter electrode 302 or between segments 706 of different transmitter electrodes 302. Further, in any of the earlier-discussed embodiments, the size, shape and/or location of the floating electrodes 710 may be selected to increase the $\Delta C_t$ to $C_t$ ratio.

Figure 8A:
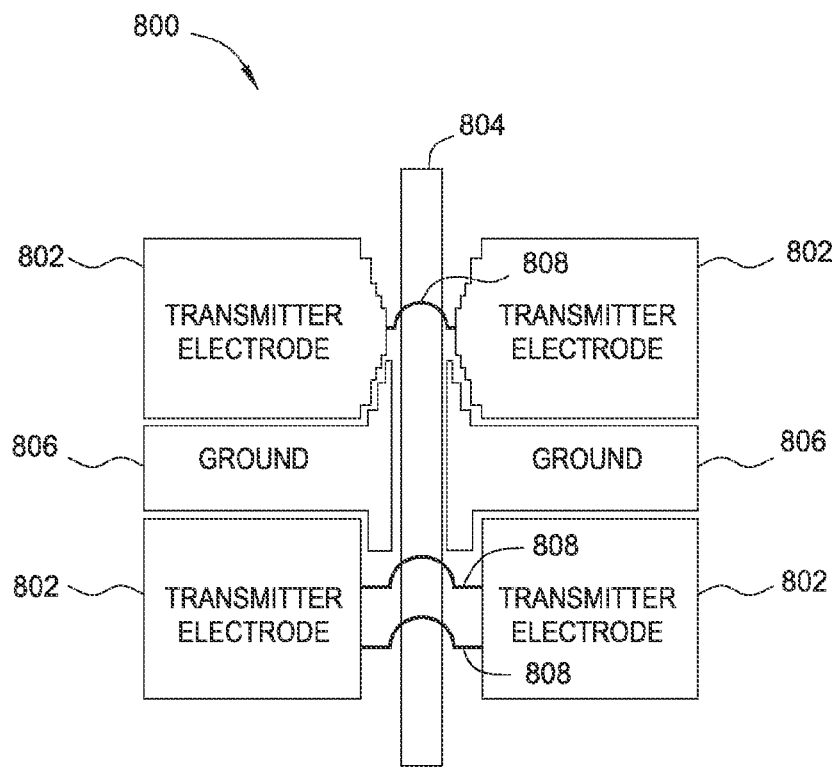
FIGS. 8A and 8B illustrate various embodiments of example sensor electrode patterns.
Figure 8B:
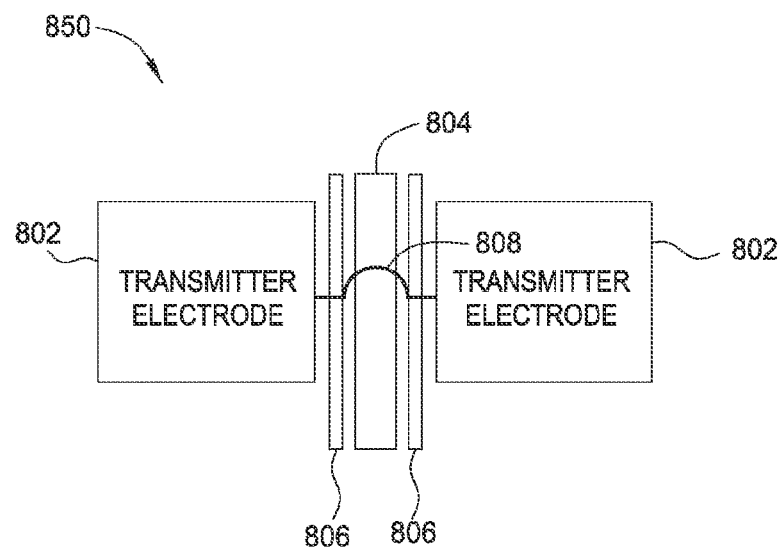

FIGS. 8A and 8B illustrate various embodiments of exemplary sensor electrode patterns 800, 850 having transmitter electrodes 802, receiver electrodes 804, ground electrodes 806, and at least one jumper 808. In the embodiment depicted in FIG. 8A, the sensor electrode pattern 800 includes at least one jumper 808, where segments of the transmitter electrode 802 may reduce in their width near a receiver electrode 804, although other configurations of jumpers and other electrode shapes may be used. In one embodiment, necking down a transmitter electrode 802 near a receiver electrode 804 reduces the transcapacitance (e.g., $C_t$) between the transmitter electrode and receiver electrode without adversely affecting the potential change in capacitive coupling (e.g., delta $C_t$) due to an input object. Further, a ground electrode 806 may be disposed between the transmitter electrodes 802 and shaped to be at least partially located between a receiver electrode 804 and transmitter electrode 802. In various embodiments, the jumpers 808 may be tunnels that are comprised within a layer of the TFT substrate 224.

FIG. 8B illustrates an embodiment of sensor electrode pattern 850 where ground electrodes 806 are disposed between a receiver electrode 804 and portions of the transmitter electrode 852. As shown, the ground electrode 806 may be used to control the capacitive coupling (e.g., $C_t$) between the transmitter electrode 852 and receiver electrode 804, reducing Ct without adversely affecting changes in capacitive coupling (e.g., delta $C_t$). It should be recognized that the embodiment illustrated in FIG. 8B, having a ground electrode placed between a transmitter electrode and receiver crossover areas, may be applied to any of the above embodiments, or separate from the above embodiments.

While the foregoing is directed to embodiments of the present disclosure, other and further embodiments of the disclosure may be devised without departing from the basic scope thereof, and the scope thereof is determined by the claims that follow.

The invention claimed is:

1. A processing system for a display device having an integrated sensing device, the processing system comprising:
    a driver module comprising driver circuitry, the driver module configured to couple to a plurality of sensor electrodes, wherein the plurality of sensor electrodes comprise an array of rectangles including at least one transmitter electrode and at least one receiver electrode, and configured to:
        drive a first sensor electrode of the plurality of sensor electrodes for absolute capacitive sensing during a first period to acquire first resulting signals; and
        drive a second sensor electrode of the plurality of sensor electrodes with a varying voltage signal during a second period to reduce the capacitive coupling between the second sensor electrode and at least one other sensor electrode of the plurality of sensor electrodes,
    wherein the first period and the second period are at least partially overlapping;
    wherein the second sensor electrode comprises a second transmitter electrode and the at least one other sensor electrode comprises a receiver electrode;
    wherein each of the plurality of sensor electrodes comprises at least one of a plurality of common electrode segments configured to be driven for display updating and capacitive sensing; and
    wherein the processing system is configured to determine positional information for an input object based on the resulting signals.

2. The processing system of claim 1, wherein the driver module is further configured to drive the second sensor electrode for capacitive sensing during a third period and drive the first sensor electrode with a varying voltage during a fourth period, wherein the third period at least partially overlaps with the fourth period.

3. The processing system of claim 1, wherein driving the first sensor electrode for capacitive sensing comprises driving the first sensor electrode with a transmitter signal and receiving the resulting signals with a third sensor electrode of the plurality of sensor electrodes.

4. The processing system of claim 1, wherein the processing system comprises a first controller communicatively coupled to a second controller.

5. The processing system of claim 1, wherein the processing system comprises a single controller.

6. An input device comprising:
    a plurality of sensor electrodes, wherein each sensor electrode of the plurality of sensor electrodes comprise at least one common electrode segments of a plurality of common electrode segments of a display device, wherein the plurality of common electrodes are configured to be driven for display updating and capacitive sensing, and wherein the plurality of sensor electrodes comprise an array of rectangles including at least one transmitter electrode and at least one receiver electrode; and
    a processing system configured to couple to the plurality of sensor electrodes and configured to:
        drive a first sensor electrode of the plurality of sensor electrode for absolute capacitive sensing during a first period to acquire first resulting signals,
        drive a second sensor electrode of the plurality of sensor electrodes with a varying voltage signal during a second period to reduce the capacitive coupling between the second sensor electrode and at least one other sensor electrode of the plurality of sensor electrodes, wherein the first period and the second period are at least partially overlapping, and wherein the second sensor electrode comprises a second transmitter electrode and the at least one other sensor electrode comprises a receiver electrode; and
        determine positional information for an input object based on the resulting signals.

7. The input device of claim 6, wherein the processing system is further configured to drive the second sensor electrode for capacitive sensing during a third period and drive the first sensor electrode with a varying voltage during a fourth period, wherein the third period at least partially overlaps with the fourth period.

8. The input device of claim 6, wherein driving the first sensor electrode for capacitive sensing comprises driving the first sensor electrode with a transmitter signal and receiving the resulting signals with a third sensor electrode of the plurality of sensor electrodes.

9. The input device of claim 8, wherein the third sensor electrode is disposed on a color filter glass of the display device.

10. The input device of claim 6, wherein the array of rectangles comprises rectangles of a same size and shape.

11. The input device of claim 6, wherein each sensor electrode of the plurality of sensor electrodes comprises a first plurality of common electrode segments interleaved with a second plurality of common electrode segments, and wherein the first plurality of common electrode segments is configured to be driven for display updating and the second plurality of common electrode segments are not driven for capacitive sensing.

12. The input device of claim 6, further comprising:
a plurality of ground electrodes, wherein each ground electrode comprises at least one common electrode segment of the plurality of common electrode segments, and wherein at least one ground electrode is disposed between two sensor electrodes of the plurality of sensor electrodes.

13. The input device of claim 6, wherein the processing system comprises a single controller configured to drive the first sensor electrode and the second sensor electrode and determine the positional information.

14. A method for operating a display device having an integrated capacitive sensing device, the method comprising:
driving a first sensor electrode of a plurality of sensor electrodes for absolute capacitive sensing during a first period to acquire first resulting signals, wherein the plurality of sensor electrodes comprise an array of rectangles including at least one transmitter electrode and at least one receiver electrode;
driving a second sensor electrode of the plurality of sensor electrodes with a varying voltage signal during a second period to reduce the capacitive coupling between the second sensor electrode and at least one other sensor electrode of the plurality of sensor electrodes, wherein the first period and the second period are at least partially overlapping, wherein the second sensor electrode comprises a second transmitter electrode and the at least one other sensor electrode comprises a receiver electrode, and wherein each of the plurality of sensor electrodes comprises at least one of a plurality of common electrode segments configured to be driven for display updating and capacitive sensing; and
determining positional information for an input object based on the resulting signals.

15. The method of claim 14, further comprising:
driving the second sensor electrode for capacitive sensing during a third period and driving the first sensor electrode with a varying voltage during a fourth period, wherein the third period at least partially overlaps with the fourth period.

16. The method of claim 14, wherein driving the first sensor electrode for capacitive sensing comprises driving the first sensor electrode with a transmitter signal and receiving the resulting signals with a third sensor electrode of the plurality of sensor electrodes.

* * * * *